United States Patent
Su et al.

(10) Patent No.: US 6,748,288 B2
(45) Date of Patent: Jun. 8, 2004

(54) SEMICONDUCTOR WAFER MANUFACTURING EXECUTION SYSTEM WITH RECIPE DISTRIBUTION MANAGEMENT DATABASE

(75) Inventors: Yeaun-Jyh Su, Hsinchu (TW); Chen-Chung Yu, Hsinchu (TW); Chih-Huang Lin, Hsinchu (TW); Chu-Shan Yu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 149 days.

(21) Appl. No.: 10/136,757

(22) Filed: Apr. 30, 2002

(65) Prior Publication Data

US 2003/0204281 A1 Oct. 30, 2003

(51) Int. Cl.⁷ .............................................. G06F 19/00
(52) U.S. Cl. ...................................... 700/108; 700/121
(58) Field of Search .......................... 700/3, 9, 17, 33, 700/25, 5, 121, 108, 110, 48, 49, 53; 709/102, 103, 104; 707/503

(56) References Cited

U.S. PATENT DOCUMENTS

| | | | | |
|---|---|---|---|---|
| 5,591,299 A | * | 1/1997 | Seaton et al. | 700/121 |
| 6,000,830 A | * | 12/1999 | Asano et al. | 700/121 |
| 6,035,293 A | * | 3/2000 | Lantz et al. | 707/1 |
| 6,101,419 A | * | 8/2000 | Kennedy et al. | 700/3 |
| 6,415,193 B1 | * | 7/2002 | Betawar et al. | 700/97 |

* cited by examiner

Primary Examiner—Leo Picard
Assistant Examiner—Kidest Bahta
(74) Attorney, Agent, or Firm—Stout, Uxa, Buyan & Mullins LLP

(57) ABSTRACT

A semiconductor manufacturing execution system (MES) is disclosed, including a memory module, a comparing module, and an outputting module. The memory module stores a basic database and a recipe distribution management (RDM) database. The basic database includes multiple basic records, and the RDM database includes multiple RDM records. The comparing module compares operation data, received from a manufacturing machine, to each of the RDM records, and secondarily to each of the basic records, to determine whether the operation data matches at least one of the RDM and basic records. The outputting module outputs a limiting signal to the manufacturing machine if the operation data matches at least one of the RDM records. The limiting signal prevents the manufacturing machine from executing a process corresponding to the operation data. The outputting module may also output a first alarm signal to the manufacturing machine, and a second alarm signal to the user interface, if the operation data does not match at least one of the RDM and basic records. The semiconductor MES may also embody methods for adding new RDM records to the RDM database, editing RDM records in the RDM database, and/or deleting RDM records from the RDM database.

20 Claims, 6 Drawing Sheets

SEMICONDUCTOR WAFER MANUFACTURING EXECUTION SYSTEM WITH RECIPE DISTRIBUTION MANAGEMENT DATABASE

Cross-Reference To Related Applications

This patent application is related to a co-pending patent application entitled "Semiconductor Wafer Manufacturing Execution System With Special Engineer Requirement Database" filed on April 30, which is commonly assigned and the contents of which are expressly incorporated herein by reference.

BACKGROUND OF THE INVENTION

1. Field of the Invention

The present invention relates generally to semiconductor fabrication systems, and, more particularly, to semiconductor wafer fabrication systems including manufacturing execution systems.

2. Description of Related Art

Integrated circuits are typically formed by processing several semiconductor wafers as a group or "lot" through a series of wafer fabrication process tools (hereafter, "process tools"). Each process tool typically performs a single wafer fabrication operation upon the semiconductor wafers. The integrated circuits formed in this manner are substantially identical to one another. Following wafer fabrication, the integrated circuits are typically subjected to functional testing, and then separated to form individual integrated circuits called "chips" or "die." Fully functional die are typically packaged and sold as individual units.

Driven by fierce competition, semiconductor fabrication facilities are economically compelled to ensure efficient scheduling and utilization of process tools. To increase equipment productivity, many modern semiconductor wafer fabrication systems include a centralized manufacturing execution system (MES). Functions performed by a typical MES may include: work in process (WIP) tracking, resource allocation and status, operations scheduling, quality data collection, and process control. A MES may also function as a central depository for data collection and distribution. For instance, a MES can, in real-time, dynamically collect, combine and express the data of raw materials, finished products, semi-finished products, machines, time, costs, etc., and can trace and control each manufacturing process.

A typical MES includes a single database for storing information used to automatically monitor and control process tools. For example, in a semiconductor wafer fabrication system including a MES, the single database of the MES may be a "basic" database including "basic" records, wherein each basic record includes information to be used by a process tool to automatically execute a process. The MES may compare operation data received from the process tool to each of the basic records, and allow the process to be executed only if the operation data matches a basic record.

A problem arises in the above described semiconductor wafer fabrication system in that in some situations, the MES may deny execution of a process even though the operation data matches a basic record in the basic database. The MES may deny execution of a process, for example, when tool performance decreases or when a defect is found in the wafer process. Because the tool performance decreases, in such situations, the problem is typically resolved by removing the basic record which matched the operation data, and later restoring the basic record to maintain the basic database. A substantial amount of time can be expended in removing and restoring basic records.

A need thus exists in the prior art to eliminate manually removing, and later restoring, records in an MES database in order to allow a process to be automatically carried out within a process tool.

SUMMARY OF THE INVENTION

The present invention addresses these needs by providing a semiconductor MES including a memory module, a comparing module, and an outputting module. The memory module stores a basic database and a recipe distribution management (RDM) database. The basic database includes multiple basic records, and the RDM database includes multiple RDM records.

The comparing module compares operation data, received from a manufacturing machine, to each of the basic records, and secondarily to each of the RDM records, to determine if the operation data matches at least one of the basic records and the RDM records. The outputting module outputs a limiting signal to the manufacturing machine if the operation data matches at least one of the RDM records. The limiting signal prevents the manufacturing machine from executing a process corresponding to the operation data.

The outputting module may also output a first alarm signal to the manufacturing machine, and a second alarm signal to the user interface, if the operation data does not match at least one of the basic records and the RDM records.

The semiconductor MES may also embody methods for adding new RDM records to the RDM database, editing RDM records in the RDM database, and/or deleting RDM records from the RDM database.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCIRPTION OF THE DRAWINGS

DETAILED DESCRIPTION OF THE PRESENTLY PREFERRED EMBODIMENTS

Figure 1:
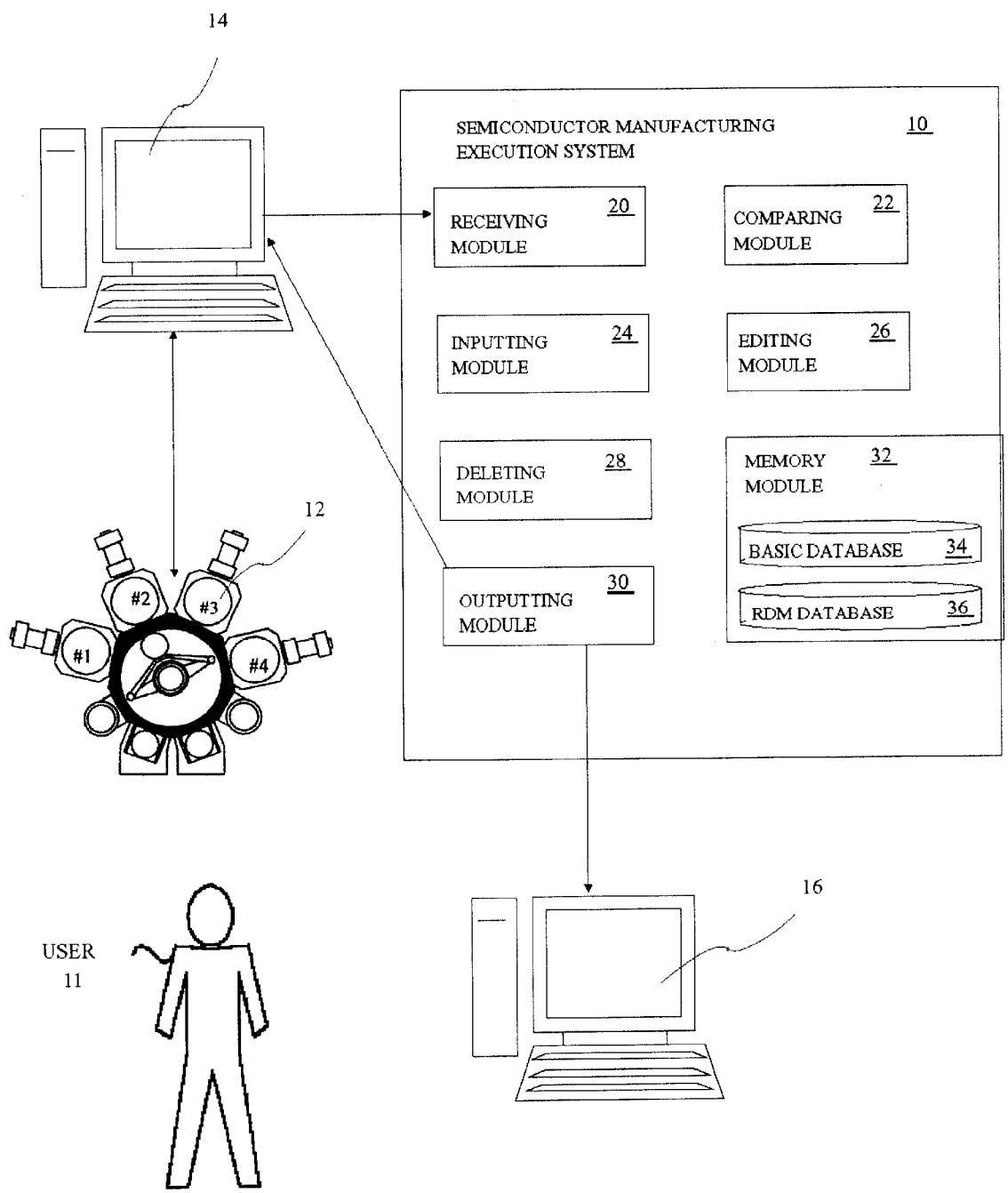
FIG. 1 shows one embodiment of a semiconductor wafer fabrication system including a semiconductor manufacturing execution system (MES), wherein the MES includes a basic database, and a recipe distribution management (RDM) database.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. For example, it is understood by a person of ordinary skill practicing this invention that any manufacturing execution system (MES) which includes means for identifying processes which may be denied execution, may benefit from a second database with easily created, edited, and deleted records, which second database may override the standard means for identifying processes that may be denied execution.

It is to be understood and appreciated that the process steps and structures described herein do not cover a complete process flow for the semiconductor MES disclosed herein. The present invention may be practiced in conjunction with various semiconductor manufacturing techniques that are conventionally used in the art, and only so much of the commonly practiced process steps are included herein as are necessary to provide an understanding of the present invention.

Referring to the drawings, FIG. 1 shows one embodiment of a semiconductor MES 10 including a receiving module 20, a memory module 32, a comparing module 22, an inputting module 24, an editing module 26, a deleting module 28, and an outputting module 30. The MES 10 operatively connects with a manufacturing machine 12, a cell controller 14, and a user interface 16.

The modules 20, 22, 24, 26, 28, 30, and 32 may be implemented in a computer apparatus. The computer apparatus may be a conventional computer device, which may include a storage device, an interface, an input device, and a central processing unit (CPU). The storage device may be a computer readable data storage device such as a hard disk drive (HDD), a compact disk read-only memory (CD-ROM), dynamic random access memory (DRAM) or EEPROM. The interface establishes signal communications between the cell controller 14 and the user interface 16. The preferred interface is a local area network (LAN); however, those skilled in the art will recognize that the interface may use other communications methods, and those other methods are intended to fall within the scope of the present invention.

The cell controller 14 preferably establishes signal communications with the manufacturing machine 12 using message transfer protocols described by Semiconductor Equipment and Materials International (SEMI) (San Jose, Calif.) E5, and communicates with the manufacturing machine 12 using the SEMI equipment communication standard II (SECS II). The SEMI equipment communication standard (SECS) specifies a group of messages, and the respective syntax and semantics for those messages, relating to semiconductor manufacturing equipment control. Those skilled in the art will recognize that other communications standards exist, and a semiconductor MES using another communications standard is intended to come within the scope of the present invention.

The input device can be a mouse or keyboard, so that a user 11 can input messages and control those modules with the input device. The CPU can be any central processor structure in the prior art, e.g. ALU, registers and controllers, for performing various data processing and operations and controlling the action procedure of each device in the computer apparatus.

In one embodiment, the modules 20, 22, 24, 26, 28, 30, and 32 are software modules stored in the storage device. After loading the modules 20, 22, 24, 26, 28, 30, and/or 32, the CPU can implement the function of the modules 20, 22, 24, 26, 28, 30, and/or 32 through devices in the computer apparatus. However, those skilled in the art will recognize that the software modules disclosed herein may be implemented in hardware, such as an application-specific integrated circuit (ASIC) and the like, without departing from the spirit and scope of the invention.

Figure 2:
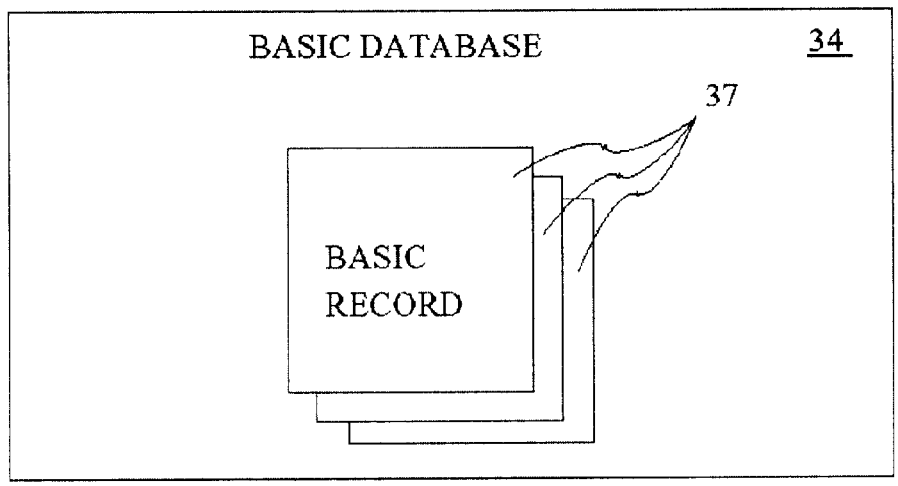
FIG. 2 shows one embodiment of the basic database of FIG. 1.
Figure 3:
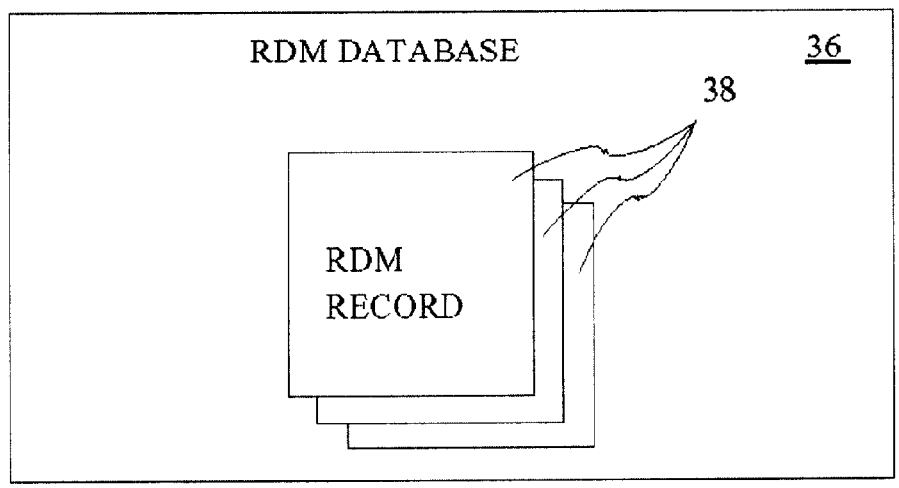
FIG. 3 shows one embodiment of the RDM database of FIG. 1.

The memory module 32 stores a basic database 34 and a recipe distribution management (RDM) database 36. One embodiment of the basic database 34 includes a plurality of basic records 37 as shown in FIG. 2, and one embodiment of the RDM database 36 includes a plurality of RDM records 38 as shown in FIG. 3. As presently embodied, each of the basic records 37 includes a lot ID, a recipe ID, and a chamber ID, and may be used for auto-execution in the manufacturing machine 12 (FIG. 1). In the illustrated embodiment, a RDM record can comprise, for example, a "product ID," "route name," "operation No.," "tool ID," and "recipe ID." As presently embodied, RDM records indicate the process name as being limited from some tools. Thus, as distinguished from basic records which indicate that a given tool can be processed, RDM records indicate that the tool cannot be processed. Each of the RDM records 38 includes a code (e.g., a recipe ID), which may be compared to operation data received from the manufacturing machine 12.

The comparing module 22 determines whether the operation data should be limited or not according to the RDM records 38. When a lot list is selected from certain idle tool, the original MES provides a MES lot list (basic record 37) and then feeds the MES lot list to the comparing module 22. The comparing module 22 then compares the RDM record of product name/route-operation/tool ID/recipe name with the MES lot list (this is the comparing module 22 functionality). If the data matches then the comparing module 22 will mark (or filter) the data and then send it to the outputting module 30. When the operation data is not limited, the comparing module 22 further compares the operation data with the basic records 37 to determine for example whether alarms should be generated.

The receiving module 20 inputs data through the interface, and the outputting module 30 outputs data through the interface. Thus, the receiving module 20 can receive an operation data from the manufacturing machine 12 through the cell controller 14. The outputting module 30 can output a limiting signal to the manufacturing machine 12 through the cell controller 14 when the operation data is limited. As described below, the limiting signal prevents the manufacturing machine 12 from executing a process corresponding to the operation data.

The outputting module 30 also can output an alarm signal to the manufacturing machine 12 through the cell controller 14 when the operation data does not match any one of basic records. Further, the outputting module 30 can output the limiting signal or the alarm signal to the user interface 16 so as to warn the user 11.

The user 11 can input a new RDM record 38 to update the RDM database 36 using the inputting module 24, edit an existing RDM record 38 using the editing module 26, and delete an existing RDM record 38 using the deleting module 28. In this embodiment, the user 11 inputs, edits and deletes data using the input device 16.

Figure 4:
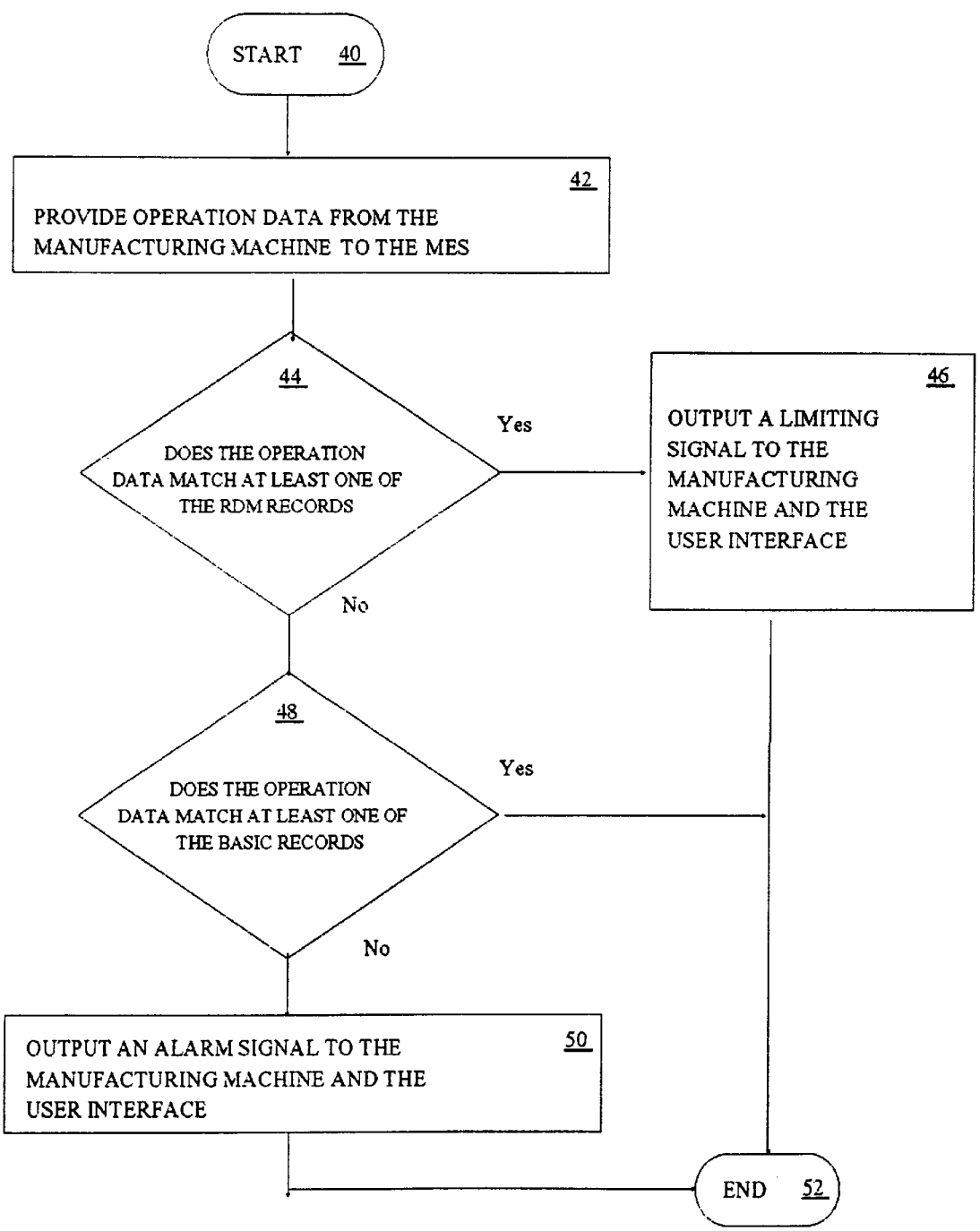
FIG. 4 depicts one embodiment of manufacturing execution system method, which may be embodied within the MES of FIG. 1.

Referring to FIG. 4, one embodiment of a semiconductor manufacturing execution method includes several steps described below. In step 42, an operation data is received from the manufacturing machine 12 (FIG. 1) through the cell controller 14 (FIG. 1). The manufacturing machine 12 outputs the operation data to the cell controller 14, and the cell controller 14 receives and transfers the operation data to the semiconductor MES 10 (FIG. 1). Preferably, the manufacturing machine 12 and the cell controller 14 communicate with one another using the SEMI equipment communication standard (SECS), and the cell controller 14 and the MES 10 communicate with one another using the network. However, those skilled in the art will recognize that other communications standards may be exercised within the MES 10, and are intended to come within the scope of the present invention.

In step 44, the comparing module 22 compares the operation data to the RDM records 38. If the operation data matches at least one of the RDM records 38 (i.e., the operation data is limited), step 46 is executed. If the operation data does not match at least one of the RDM records 38 (i.e., the operation data is not limited), step 48 is executed. For example, if the RDM records 38 include or define a recipe ID 001 as a limited condition, and the operation data includes recipe ID 001, a match occurs and step 46 is executed.

In step 46, the outputting module 30 outputs a first limiting signal to the manufacturing machine 12, preventing the execution of the process corresponding to the operation data. The outputting module 30 further outputs a second limiting signal to the user interface 16 using the network, so that the user 11 may take action to correct the error. In a modified embodiment, the first and second limiting signals can be the same. The outputting module 30 will output the second limiting signal to a pre-assigned user interface 16 for each manufacturing machine, so that the user 11 can see the alarm message on the user interface 16.

In step 48, the comparing module 22 determines whether the operation data matches any of the basic records 37. If the operation data matches one of the basic records 37, end 52 is executed, and the process can be executed normally. When the operation data does not match any one of the basic records 37, step 50 is executed.

In step 50, the outputting module 30 outputs a first alarm signal to the manufacturing machine 12 and a second alarm signal to the user interface 16. The alarm signal may be sent to the manufacturing machine 12 through the cell controller 14, and may be sent to the user interface 16 by the network. Thus, the user 11 is informed to take action to correct the error. For example, operation of the manufacturing machine 12 may be held or limited. In a modified embodiment, the first alarm signal and the second alarm signal are the same.

Figure 5:
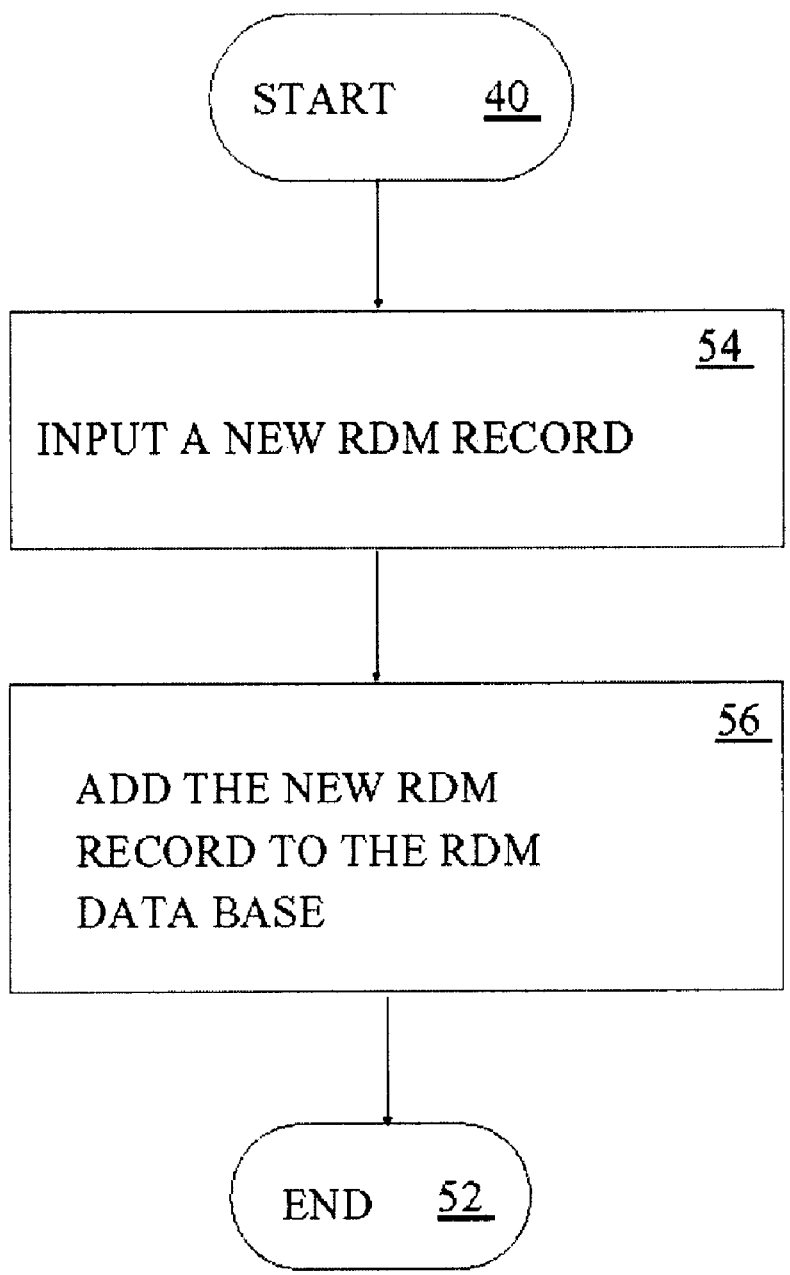
FIG. 5 depicts one embodiment of a method for adding a new RDM record to the RDM database of FIG. 1.
Figure 6:
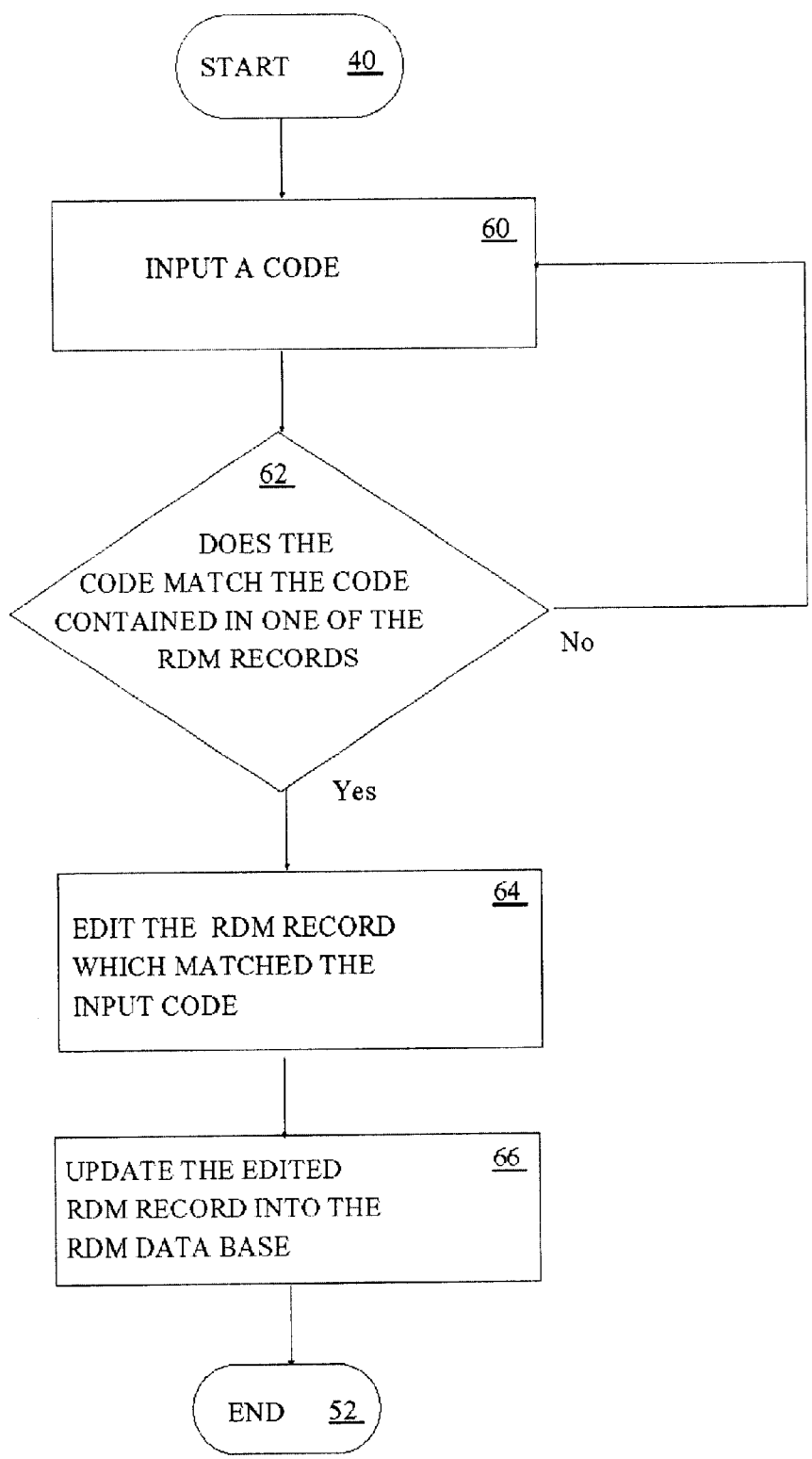
FIG. 6 depicts one embodiment of a method for editing an existing RDM record of the RDM database of FIG. 1.
Figure 7:
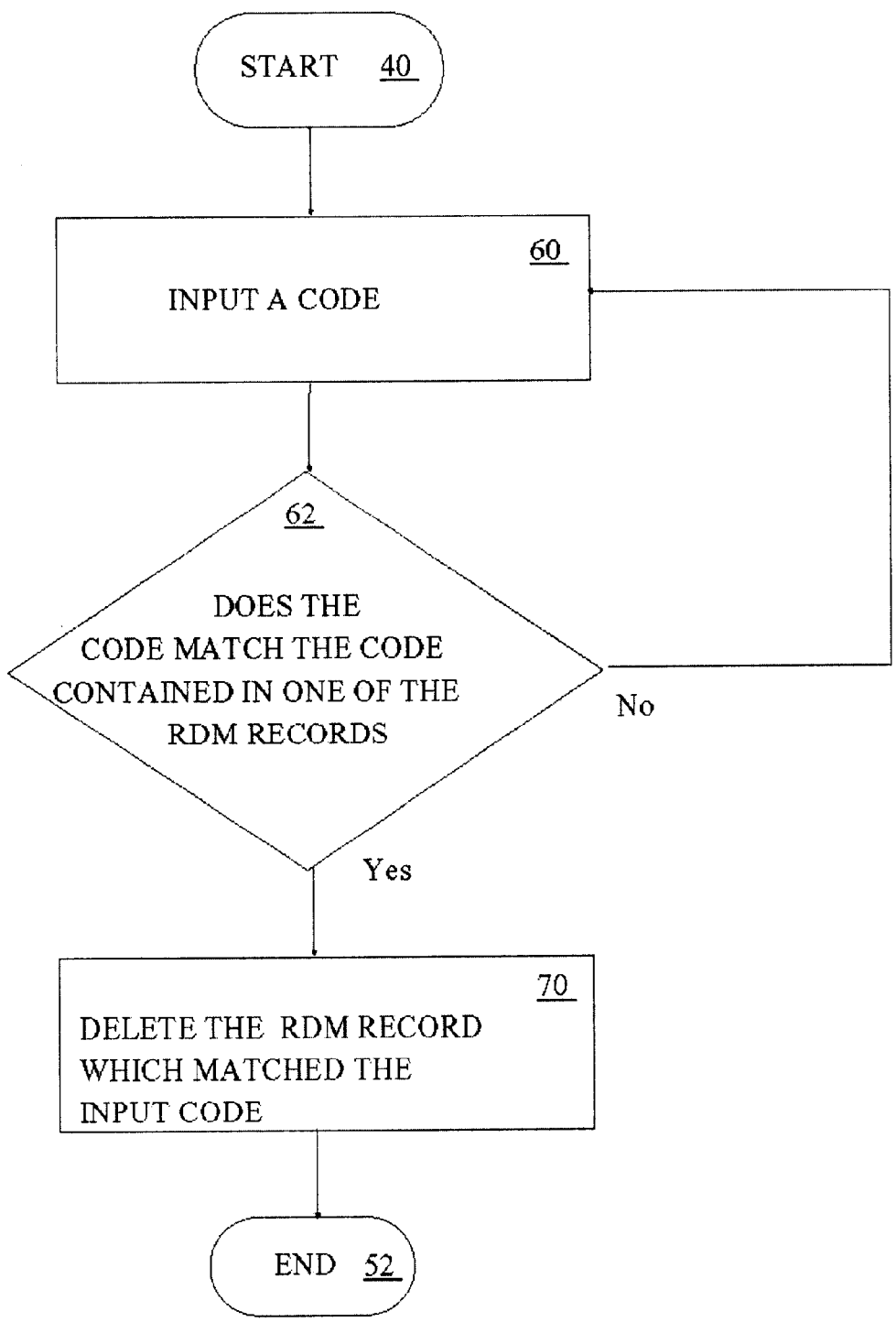
FIG. 7 depicts one embodiment of a method for deleting a RDM record from the RDM database of FIG. 1.

FIGS. 5–7 will now be used to illustrate how the RDM records 38 (FIG. 3) may be added to, edited, and deleted from the RDM database 36 (FIGS. 1 and 3). Referring to FIG. 5, a method for adding a new RDM record 38 to the RDM database 36 is shown. In step 54, the user 11 inputs the new RDM record 38 via, for example, the user interface 16 (FIG. 1) and the inputting module 24 (FIG. 1). In step 56, the new RDM record 38 is added to the RDM database 36.

Referring to FIG. 6, a method for editing an RDM record 38 in the RDM database 36 is shown. In step 60, the user 11 inputs a code (e.g., a recipe code, or recipe ID) via, for example, the user interface 16 (FIG. 1) and the inputting module 24 (FIG. 1). In step 62, the comparing module 22 (FIG. 1) determines whether the recipe code matches a recipe code of one of the RDM records 38 in the RDM database 36. If the recipe code matches the recipe code of one of the RDM records 38, step 64 is executed. In step 64, the user 11 edits an RDM record 38, which as presently preferred is the RDM record 38 having the same recipe code. The user 11 edits the RDM record 38 via, for example, the user interface 16 (FIG. 1) and the editing module 26 (FIG. 1). In step 66, the edited RDM record 38 is updated in the RDM database 36.

Referring to FIG. 7, a method for deleting an RDM record 38 from the RDM database 36 is shown. In step 60, the user 11 inputs a code (e.g., a recipe code or recipe ID) via, for example, the user interface 16 (FIG. 1) and the inputting module 24 (FIG. 1). In step 62, the comparing module 22 determines whether the recipe code matches the recipe code of one of the RDM records 38 in the RDM database 36. If the recipe code matches the recipe code of one of the RDM records 38, step 70 is executed. In step 70, the RDM record 38 having the same recipe code is deleted from the RDM database 36.

The semiconductor MES described above thus provides a simple method for addressing processes denied execution by the manufacturing machine. As a result, there is no need to remove and later restore basic records from the basic database. Those skilled in the art will recognize that the method described for a preferred embodiment may be modified in various ways that achieve the same or similar results. Any semiconductor MES which utilizes a separate database to address the issues identified above, is intended to fall within the scope of the present invention. The above-described embodiments have been provided by way of example, and the present invention is not limited to these examples. Multiple variations and modification to the disclosed embodiments will occur, to the extent not mutually exclusive, to those skilled in the art upon consideration of the foregoing description. For example, in other embodiments of the invention, the operation data may be compared with the basic records 37 of the basic database 34 prior to, or simultaneously with, being compared with the RDM records 38 of the RDM database 36. Such variations and modifications, however, fall well within the scope of the present invention as set forth in the following claims.

What is claimed is:

1. A semiconductor manufacturing execution system (MES) for automatically determining whether a given process can be executed on a process tool, comprising:

a memory module storing a recipe distribution management (RDM) database and a basic database, the RDM database comprising a plurality of RDM records each indicating that a given process cannot be executed on a process tool, and the basic database comprising a plurality of basic records each including information to facilitate automatic execution of a process of a process tool;

a comparing module adapted to receive from a manufacturing machine operation data, which corresponds to a process to be executed on a process tool, and to compare the operation data to the RDM records in order to determine whether a process corresponding to the operation data should not be executed and to the basic records in order to determine whether a process corresponding to the operation data can be executed normally; and an outputting module adapted to output a first limiting signal if the operation data matches at least one of the RDM records, the first limiting signal preventing execution on a process tool of a process corresponding to the operation data.

2. The semiconductor MES of claim 1, wherein:
the comparing module compares the operation data to the RDM records to determine whether the operation data is limited, and when the operation data is not limited, compares the operation data with the basic records.

3. The semiconductor MES of claim 1, wherein:
the output module is adapted to output at least one of a first limiting signal to the manufacturing machine and a second limiting signal to a user interface, if the operation data matches at least one of the RDM records; and
the outputting module is adapted to output an alarm signal if the operation data does not match at least one of the basic records and the RDM records.

4. The semiconductor MES of claim 1, wherein:
the semiconductor MRS further comprises a receiving module adapted to receive the operation data from the manufacturing machine; and
the outputting module is adapted to output at least one of a first alarm signal to the manufacturing machine and a second alarm signal to a user interface if the operation data does not match at least one of the basic records and the RDM records.

5. The semiconductor MES of claim 4, wherein the MES is operably coupled to a cell controller, and wherein:
the receiving module is adapted to receive the operation data from the manufacturing machine through the cell controller; and
the outputting module is adapted to output the first limiting signal to the manufacturing machine through the cell controller.

6. The semiconductor MES of claim 1, wherein:
the MES is operably coupled to a user interface, and
the outputting module is further adapted to output a second limiting signal if a match does not occur between the operation data and at least one of the RDM records, and to output at least one of a first alarm signal to the manufacturing machine and a second alarm signal to the user interface if the operation data does not match at least one of the basic records and the RDM records.

7. The semiconductor MES of claim 1, further comprising an inputting module adapted to allow a user to input a new RDM record to be added to the RDM database.

8. The semiconductor MES of claim 1, further comprising an editing module adapted to allow a user to edit one of the RDM records.

9. The semiconductor MES of claim 1, further comprising a deleting module adapted to allow a user to delete one of the RDM records.

10. A semiconductor manufacturing execution method for automatically determining whether a given process can be executed on a process tool, comprising:
receiving operation data from a manufacturing machine, the operation data corresponding to a process to be executed on a process tool;
comparing the operation data to a plurality of recipe distribution management (RDM) records to determine if the operation data matches any of the RDM records, each of the RDM records indicating that a given process cannot be executed on a process tool;
if the operation data does not match any of the RDM records, comparing the operation data to a plurality of basic records to determine if the operation data matches any of the basic records, each of the basic records including information to facilitate automatic execution of a process on a process tool; and
outputting a signal, based upon the comparing of the operation data to the RDM records and the basic records, wherein the signal prevents execution on a process tool of a process corresponding to the operation data if the operation data matches at least one of the RDM records.

11. The method of claim 10, wherein the outputting of a signal comprises:
outputting a first limiting signal to the manufacturing machine if the operation data matches any of the RDM records; and
outputting a first alarm signal to the manufacturing machine if the operation data does not match any of the RDM records and the basic records.

12. The method of claim 11, further comprising:
outputting a second limiting signal to a user interface if the operation data matches any of the RDM records; and
outputting a second alarm signal to a user interface if the operation data does not match any of the RDM records and the basic records.

13. The method of claim 11, wherein:
the receiving comprises receiving operation data from a manufacturing machine through a cell controller;
the outputting of a first limiting signal comprises outputting a first limiting signal to the manufacturing machine through the cell controller; and
the outputting of a first alarm signal comprises outputting a first alarm signal to the manufacturing machine through the cell controller.

14. A fabrication system for automatically determining whether a given process can be executed on a process tool comprising:
a manufacturing machine;
a manufacturing execution system (MES) including a comparing module, a basic database having first records and a second database having second records, wherein the second database is adapted to be easily modified;
a first interface operably coupled between the manufacturing machine and the MES, wherein the MES is adapted to receive operation data from the manufacturing machine via the first interface and to provide first signals to the manufacturing machine via the first interface, the operation data corresponding to a process to be executed on a process tool;
a second interface operably coupled to the MES, wherein the MES is adapted to provide second signals to a user via the second interface; and
wherein the comparing module is adapted to compare the operation data to the second records, and if the operation data matches at least one of the second records, the MES is adapted to generate at least one limiting signal to thereby prevent execution on a process tool of a process corresponding to the operation data.

15. The fabrication system of claim 14, wherein the at least one limiting signal comprises a first limiting signal and a second limiting signal, wherein the first signals include the first limiting signal, and wherein the second signals include the second limiting signal.

16. The fabrication system of claim 14, wherein the first records are basic records, wherein the comparing module is further adapted to compare the operation data to the basic records, and wherein if the operation data does not match at least one of the second records, and the operation data does not match at least one of the basic records, the MES is adapted to generate at least one alarm signal.

17. The fabrication system of claim 16, wherein the at least one alarm signal comprises a first alarm signal and a second alarm signal, wherein the first signals further includes the first alarm signal, and wherein the second signals further include the second alarm signal.

18. The fabrication system of claim 14, wherein the MES further includes an inputting module adapted to allow a user to input a new second record to be added to the second database.

19. The fabrication system of claim 14, wherein the MES further includes an editing module adapted to allow a user to edit one of the second records.

20. The fabrication system of claim 14, wherein the MES further includes a deleting module adapted to allow a user to delete one of the second records.

* * * * *